United States Patent
Tu et al.

(10) Patent No.: US 7,122,424 B2
(45) Date of Patent: Oct. 17, 2006

(54) METHOD FOR MAKING IMPROVED BOTTOM ELECTRODES FOR METAL-INSULATOR-METAL CROWN CAPACITORS

(75) Inventors: Yeur-Luen Tu, Taichung (TW); Yuan-Hung Liu, Hsin-Chu (TW); Chi-Hsin Lo, Jhubei (TW); Chia-Shiung Tsai, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 156 days.

(21) Appl. No.: 10/788,175

(22) Filed: Feb. 26, 2004

(65) Prior Publication Data

US 2005/0191820 A1    Sep. 1, 2005

(51) Int. Cl.
*H01L 21/8242* (2006.01)
(52) U.S. Cl. ...................... 438/253; 438/692
(58) Field of Classification Search .......... 438/253, 438/255, 396, 397, 692
See application file for complete search history.

(56) References Cited

U.S. PATENT DOCUMENTS

| | | | |
|---|---|---|---|
| 5,270,241 A * | 12/1993 | Dennison et al. ........... 438/396 |
| 6,168,987 B1 | 1/2001 | Jeng et al. ................... 438/253 |
| 6,177,351 B1 | 1/2001 | Beratan et al. ............. 438/694 |
| 6,180,483 B1 | 1/2001 | Linliu .......................... 438/396 |
| 6,344,392 B1 | 2/2002 | Liaw ........................... 438/254 |
| 6,362,042 B1 * | 3/2002 | Hosotani et al. ............ 438/253 |
| 6,583,021 B1 * | 6/2003 | Song ........................... 438/396 |
| 6,720,232 B1 * | 4/2004 | Tu et al. ..................... 438/396 |
| 6,884,692 B1 * | 4/2005 | Rhodes et al. ............. 438/399 |

* cited by examiner

*Primary Examiner*—Tuan H. Nguyen
(74) *Attorney, Agent, or Firm*—Thomas, Kayden, Horstemeyer & Risley

(57) ABSTRACT

A method for making crown-shaped capacitors with uniform capacitance from the center to the edge of the DRAM device is achieved. The uniform capacitance is achieved using a two-step planarization process or a uniformly deposited CVD sacrificial layer. After forming a first conducting layer in openings in an insulator, a sacrificial layer is spin coated on the substrate. The non-uniformity, by virtue of the spin coating, is then partially polished back to form a globally uniform surface followed by a plasma etch-back to leave portions of the sacrificial layer of equal height in the openings. The first conducting layer in the openings is uniformly recessed for making capacitors having uniform values across the DRAM device. In a second approach a relatively thin uniform CVD polymer is deposited requiring only a single polishing step or etch-back to achieve uniform portions of the polymer in the openings.

16 Claims, 6 Drawing Sheets

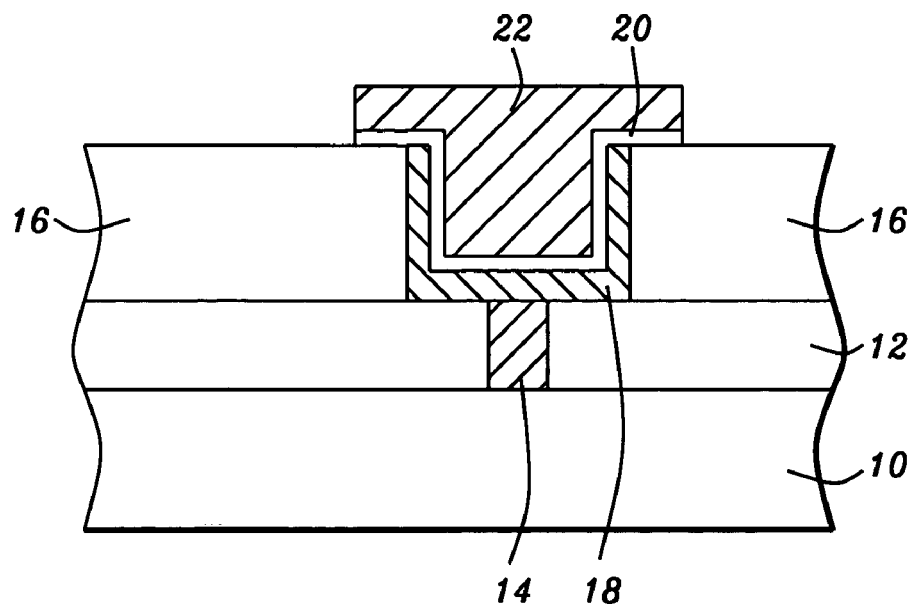
FIG. 1 – Prior Art
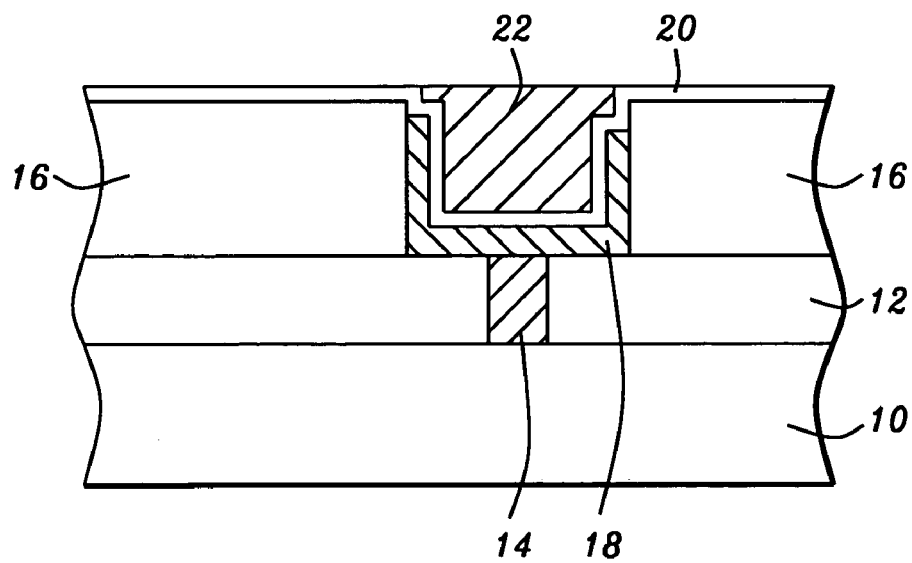
FIG. 2 – Prior Art

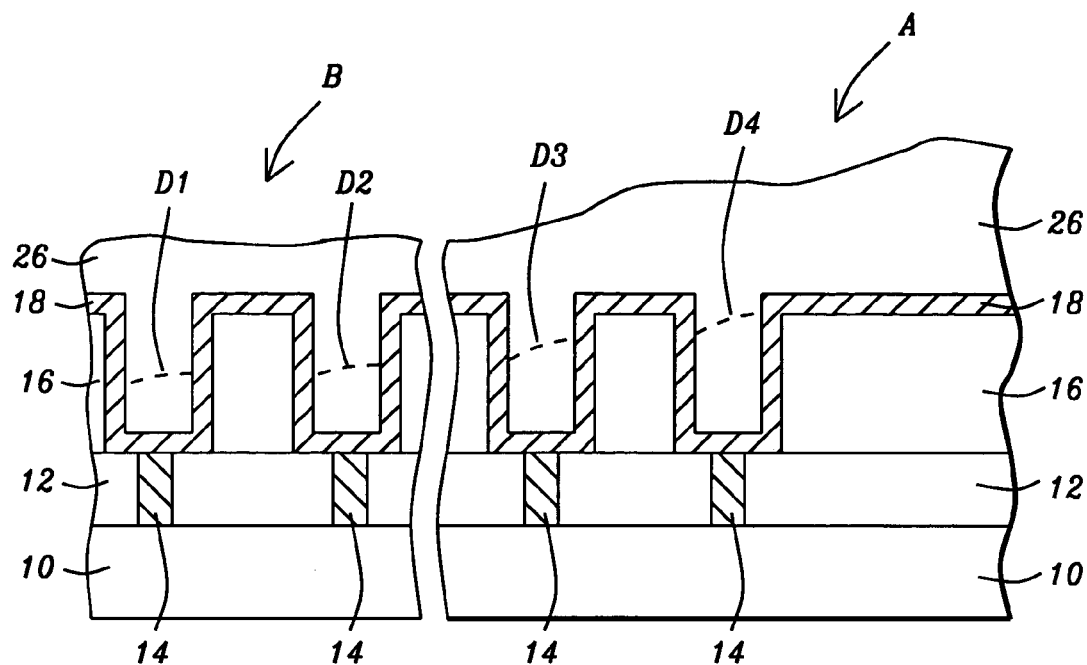
FIG. 3 – Prior Art
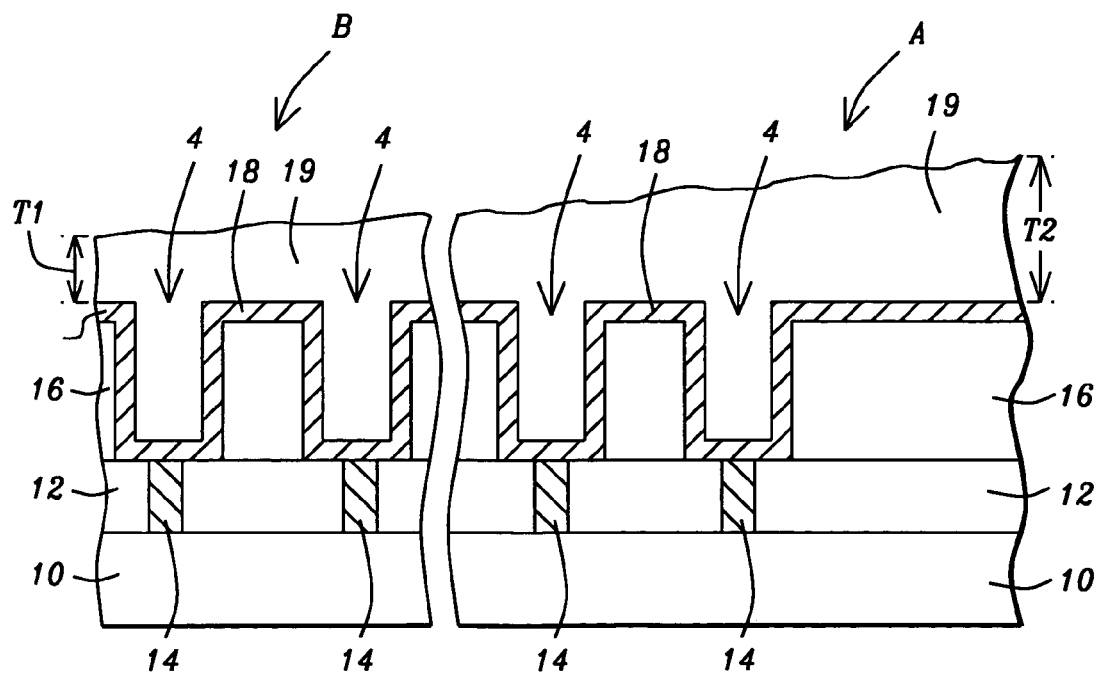
FIG. 4

METHOD FOR MAKING IMPROVED BOTTOM ELECTRODES FOR METAL-INSULATOR-METAL CROWN CAPACITORS

BACKGROUND OF THE INVENTION (1) Field of the Invention

The present invention relates to a process for making an array of metal-insulator-metal (MIM) crown storage capacitors for dynamic random access memory (DRAM) devices, and more specifically for making an array of improved MIM capacitor bottom electrodes that are recessed to reduce memory cell area and increase circuit density. The method utilizes a sequence of process steps that includes a novel planarization process for making the bottom electrodes with a more uniform recess depth in insulator openings for better process control across the wafer. This provides a more uniform capacitance for the array of capacitors across each chip and across the wafer (substrate).

(2) Description of the Prior Art

Dynamic random access memory (DRAM) circuits are used extensively in the electronics industry for storing data. The DRAM circuit includes an array of memory cells, each cell consisting of a single capacitor and a single transfer transistor. Typically the transfer transistor is a field effect transistor (FET). Binary data (1 and 0) are stored as charge on the capacitors, and the transfer transistors are used to retain the charge. During the read cycle the transfer transistors are used to interrogate the cell by means of an array of bit lines. Two types of memory cells that are commonly used include a cell having a trench capacitor formed in the substrate under the FETs, and a cell having a stacked capacitor that is built on and over the FETs on the substrate. In the coming years the number of cells on a DRAM chip is expected to exceed 1 Gigabit. This increase is a result of the downsizing of feature size of the discrete devices using improved high-resolution photolithography, improved directional plasma etching, and more recently self-aligning techniques. One method of achieving this higher density is to form crown capacitors in which the bottom electrodes are formed in an array of openings in an insulating layer over the array of capacitor node contacts to the underlying array of memory cell areas.

One type of stacked capacitor that is commonly used is the crown-shaped capacitor shown in FIG. 1. This type of capacitor is formed by depositing an interlevel insulating layer 12 on a substrate 10 having semiconductor devices, such as FETs. An array of node contacts 14, formed, for example of polysilicon, are formed in openings in the insulating layer 12 to the cell areas on the substrate 10. The FETs are not shown, and only one of the node contacts is depicted to simplify the drawing. A second insulating layer 16 is deposited, and recesses or wells are etched in layer 16 aligned over and down to the node contacts. A conformal conducting layer 18 is deposited and a sacrificial layer, such as a polymer (not shown), is used to fill the recesses. The layers are then etched or polished back to form the capacitor bottom electrodes 18, and the polymer is selectively removed. A thin capacitor dielectric film 20 is deposited. A second conducting layer 22 is deposited and a photoresist mask and etching are used to pattern the capacitor top electrodes. One disadvantage of making a capacitor by this method is that a masking step is required to pattern the top electrode, which results in increased DRAM cell size. Also, the process is not compatible with a damascene process.

An alternative prior-art approach to making an array of crown capacitors is shown in FIG. 2. In this approach the process is similar to the process shown in FIG. 1, except that the bottom electrodes 18 are recessed below the top edges of the recesses or wells in the second insulating layer 16. A thin capacitor dielectric layer 20 is deposited over the recessed bottom electrodes 18. A second conducting layer 22 is deposited and polished back to the top surface of the second insulating layer 16 to form self-aligned top electrodes 22 in the recesses, as shown in FIG. 2. This form capacitors having smaller surface areas and that results in higher density of memory cells and is also compatible with a damascene process.

The prior-art approach of making an array of crown-shaped capacitors having recessed bottom electrodes, as shown in FIG. 2, is achieved by the following method. After depositing a conformal first conducting layer 18 for the bottom electrodes, a sacrificial layer 26, such as a polymer or photoresist, is spin coated. Because of the topography on the substrate 10, the sacrificial layer 26 is non-uniform. For example, layer 26 is generally thicker near the edge of the array of cells on the DRAM chip, as depicted by area A in FIG. 3, and layer 26 is generally thinner over the closely spaced array of cells for the capacitors at the center of the DRAM chip, as depicted by the thinner area B. When sacrificial layer 26 is etched or polished back to expose the first conducting layer 18 to recess the bottom electrodes 18, the sacrificial layer has varying depths as depicted by the dashed lines D1, D2 at the center of the DRAM chip compared to the depth depicted by D3 and D4 in the recesses for the capacitors at the edge of the array on the chip. When the first conducting layer 18 is etched to recess the bottom electrodes, as shown in FIG. 2, the variation of the depths D1, D2, D3, and D4 of the sacrificial layer results in varying heights of capacitor bottom electrodes across the array of memory cells and also across the wafer. When the DRAM devices are completed, the large variations in the area of the bottom electrodes results in large variations in capacitance, which is undesirable.

Numerous methods of making high density DRAM devices having crown capacitors have been reported in the literature. For example, Jeng et al. in U.S. Pat. No. 6,168,987 B1 describe a method for fabricating a crown capacitor that is self-aligned to both the underlying bit lines and word lines. Jeng's array of bottom electrodes is made in an insulating layer that is later removed. Liaw, U.S. Pat. No. 6,344,392 B1, teaches a method of making a stacked capacitor having a monolithic fin structure. The structure is achieved by depositing a multilayer of different insulators with openings for capacitors, and the insulators in the openings are etched at different rates to form a mold for a fin-shaped capacitor. The bottom electrodes for the capacitors are formed in the openings. Then the multilayer of different insulators is removed to form free-standing bottom electrodes. Forming self-aligned top electrodes is not addressed. Linliu, U.S. Pat. No. 6,180,483 B1, describes a method for making multiple-crown capacitors that cannot accommodate recessing the bottom electrodes and forming self-aligned top electrodes. U.S. Pat. No. 6,177,351 B1 to Beratan et al. teaches a method of etching a thin perovskite layer overlying a second material without substantially etching the second material. However, none of the cited references addresses the prior-art problem described above.

Therefore, there is still a strong need in the industry to make crown-shaped capacitors for DRAM devices that have capacitance that lie within acceptable manufacturing tolerances.

SUMMARY OF THE INVENTION

A principal object of the present invention is to form an array of closely spaced crown-shaped capacitors, having recessed bottom electrodes in an insulating layer, for DRAM devices to achieve reduced variation in capacitance across the DRAM devices and across the wafer.

A second objective of this invention by a first embodiment is to use a novel two-step process to planarize a sacrificial layer for more uniformly recessing the bottom electrodes of crown-shaped capacitors across the wafer.

Another object of this invention is to use a partial chemical-mechanical polishing step followed by an etch-back step to achieve the novel two-step planarization process.

A further objective of this invention by a second embodiment is to use a chemical-vapor-deposited sacrificial layer which is deposited to a uniform thickness across the DRAM devices and across the wafer.

Still another objective is to chemically-mechanically polish back or etch back the sacrificial layer to expose an underlying metal layer used to make the recessed bottom electrodes.

This novel method for making an array of crown-shaped stacked capacitors having recessed bottom electrodes that are more uniform in height across the array of memory devices on a DRAM chip is now described in summary. The method begins by providing a semiconductor substrate having partially completed DRAM devices having contact areas. The substrate is typically a single-crystal silicon doped with a P type conductive dopant, such as boron (B). A node insulating layer is deposited on the substrate to insulate the underlying device areas. An array of node openings are etched in the node insulating layer to the device areas for node contacts. Plug contacts are formed in the node openings to the device areas, typically by depositing a doped polysilicon, tungsten, or the like, and polishing back. An insulating layer is deposited in which capacitors will be formed. An array of openings for the crown capacitors having recessed bottom electrodes are etched in the insulating layer aligned over and to the conducting plug contacts. A conformal first conducting layer is deposited on the insulating layer and in the openings. Next, a blanket sacrificial layer is deposited by spin coating, and is deposited sufficiently thick to fill the openings. Since the spin-coated sacrificial layer varies in thickness from center of the array to edge of the array over the openings, a key feature of this invention, by a first embodiment, is to use a two-step process to achieve a uniform removal of the sacrificial layer down to the surface of the insulating layer. This two-step process includes partially polishing back the sacrificial layer to form a planar surface across the array of openings on each chip and across the substrate. Continuing with the two-step process, an etch-back is used to remove the remaining uniformly thick sacrificial layer to expose the first conducting layer on the top surface of the insulating layer, while leaving uniformly thick portions of the sacrificial layer in the array of openings. Next, the first conducting layer is etched to the surface of the insulating layer to expose portions of the first conducting layer on the sidewalls of the openings. The exposed portions are then recessed to complete the capacitor bottom electrodes. The sacrificial layer, which protects the first conducting layer in the openings, is selectively removed in the openings. Next, a relatively thin conformal capacitor dielectric film is formed on the substrate and over the bottom electrodes in the openings. The array of capacitors are then completed by depositing a second conducting layer and polishing back the second conducting layer and the capacitor dielectric film to the surface of the insulating layer to form self-aligned top electrodes in the openings.

By a second embodiment of this invention, the sequence of process steps is the same as in the first embodiment up to and including the deposition of the first conducting layer. Then, a sacrificial layer, such as a polymer, is deposited by CVD to a thickness sufficient to protect the first conducting layer in the array of openings across the substrate. The process parameters for the chemical-vapor deposition are selected to provide a uniform thickness over the surface of the insulating layer across each chip and across the substrate. The uniform thickness of the sacrificial layer can now be chemically-mechanically polished back or plasma etched back to the first conducting layer, while leaving portions of the sacrificial layer to protect the first conducting layer in the openings. The first conducting layer is then etched to the top surface of the insulating layer exposing the first conducting layer at the edges of the openings. As in the first embodiment, the first conducting layer in the openings is recessed to form capacitor bottom electrodes. The sacrificial layer is selectively removed in the openings, and a relatively thin conformal capacitor dielectric film is formed on the substrate and over the bottom electrodes. The array of capacitors are then completed by depositing a second conducting layer and polishing back the second conducting layer and the capacitor dielectric film to the surface of the insulating layer to form self-aligned top electrodes in the openings.

BRIEF DESCRIPTION OF THE DRAWINGS

The objects and advantages of this invention are best understood with reference to the attached drawings in the figures and the embodiments that follow.

FIG. 1 shows a schematic cross-sectional view of a single DRAM crown-shaped capacitor of an array of capacitors, and having a conventional patterned capacitor top electrode.

FIG. 2 shows a schematic cross-sectional view of a single DRAM crown-shaped capacitor of an array of capacitors, and having a recessed capacitor bottom electrode and a self-aligned top electrode.

FIG. 3 shows a schematic cross-sectional view of a portion of an array of partially completed crown-shaped capacitors at the center of the array and at the edge of the array, and depicting the non-uniform etch-back of a spin-coated sacrificial layer across the array by a prior-art process.

FIGS. 4–8 are schematic cross-sectional views showing a portion of a substrate depicting the sequence of process steps, by a first embodiment, using a two-step planarization process for making an array of crown-shaped capacitors having recessed bottom electrodes with uniform heights across each chip and across the substrate.

DESCRIPTION OF THE PREFERRED EMBODIMENTS

Figure 5:
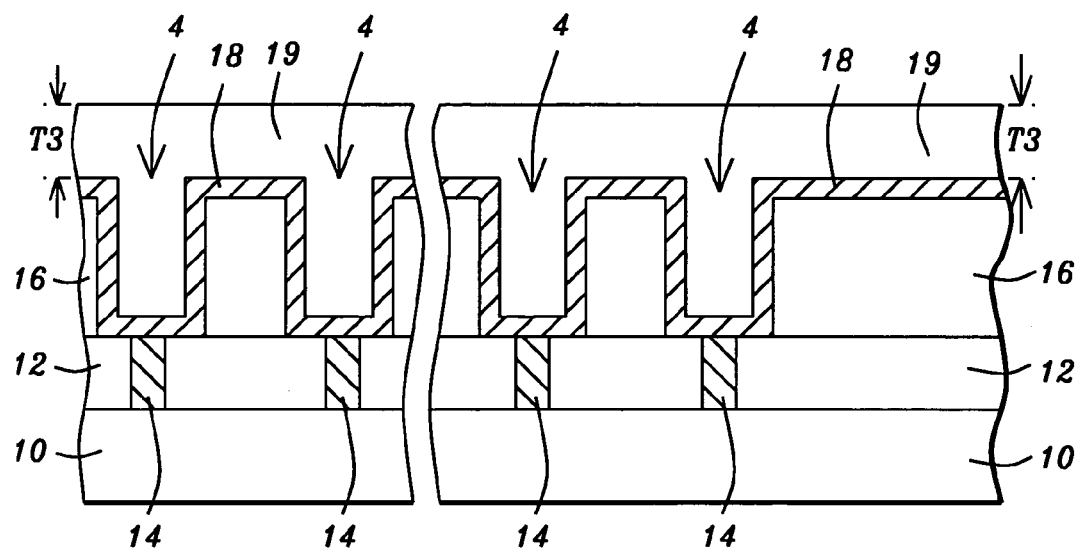

The method for making these crown-shaped capacitors with recessed bottom electrodes for higher density array of capacitors and having bottom electrodes of uniform height across the substrate is now described in detail. These capacitors having uniform height result in more uniform capacitance across each DRAM device and across the wafer. This improved process uses a two-step planarizing process of a sacrificial layer in a first embodiment. In a second embodiment, the improved process uses a CVD sacrificial layer of a uniform thickness which can then be planarized using a single chemical-mechanical polish-back or a single etch-back step by a second embodiment. Although the method is described for making improved capacitors for DRAM devices, it should be understood by those skilled in the art that the method also applies to merged DRAM/logic circuits.

Referring to FIGS. 4–8, a first embodiment for making an array of crown-shaped capacitors on a substrate is described in detail. FIG. 4 shows a schematic cross-sectional view of a portion of an array of capacitors on a substrate 10 having partially completed DRAM cells. The substrate 10 is typically a lightly doped P type single-crystal silicon having a <100> crystallographic orientation. The DRAM devices include an array of memory cell areas. Each cell area includes an FET and a capacitor, surrounded and electrically isolated by shallow trench isolation regions. The FETs and isolation regions are not shown since they are not essential for making this improved array of capacitors, and to simplify the drawings.

Still referring to FIG. 4 and referring more specifically to the invention, a node insulating layer 12 is deposited on the substrate 10 to insulate the underlying device areas. Layer 12 is preferably a silicon oxide ($SiO_2$), deposited by chemical-vapor deposition (CVD) using, for example, tetra-ethosiloxane (TEOS) as the reactant gas. The node insulating layer 12 is deposited to a thickness of between about 5000 and 10000 Angstroms. An array of node openings 2 for node contacts for the DRAM capacitors are etched in the node insulating layer 12 to the device areas. A conducting material is deposited to fill the node openings 2 and is planarized back to the node insulating layer 12 to form capacitor node contacts 14. The node contacts can be formed using a doped polysilicon. However, other materials, such as tungsten and the like, can also be used, and planarized, for example, by polishing back or by etching back. Next an insulating layer 16 is deposited on the substrate 10, in which capacitors will be formed. Layer 16 is similar to layer 12, and is $SiO_2$, deposited by CVD. The insulating layer 16 is deposited to a thickness that determines the height of the capacitor bottom electrodes, and more specifically is deposited to a thickness of between about 5000 and 15000 Angstroms. Conventional photolithography and anisotropic plasma etching are used to form an array of openings 4 in the insulating layer 16, aligned over and to the conducting plug contacts 14. A blanket conformal first conducting layer 18 for bottom electrodes is deposited on the insulating layer 16 and in the openings 4. The first conducting layer 18 is a material such as titanium nitride, tantalum nitride, or tungsten nitride, and is deposited, for example, by CVD or atomic-layer deposition. The first conducting layer 18 is deposited to a preferred thickness of between about 100 and 300 Angstroms.

Referring still to FIG. 4, a blanket sacrificial layer 19 is deposited by spin coating, as commonly practiced in the industry. Layer 19 is preferably a polymer, more specifically, a photoresist. Alternatively, the sacrificial layer 19 can be a spin-on glass. The sacrificial layer 19 is deposited sufficiently thick to fill the openings 4, and more specifically to a thickness T1 of between about 4000 and 10000 Angstroms over the top surface of the insulating layer 16. During deposition of the sacrificial layer by spin-on coating, and because of the topography of the underlying surface having closely spaced openings, the spin-coated layer varies in thickness T1 from center of the array, as shown by portion B of FIG. 4, to the thickness T2 at the edge of the array, as shown by portion A of FIG. 4, over the openings 4 in each DRAM device.

Referring to FIG. 5 and a key feature by this first embodiment is to achieve a more uniform removal of the sacrificial layer 19 down to the surface of the first conducting layer 18 on the top surface of the insulating layer 16. This uniform removal is achieved by first using a partial polish-back of the sacrificial layer 19 to form a more global planar surface across each chip and across the substrate. The partial polish-back is performed by chemical-mechanical polishing. Preferably, the sacrificial layer 19 is polished back to have a uniform thickness T3 of between about 0 and 2000 Angstroms over the insulating layer 16, as shown in FIG. 5.

Figure 6:
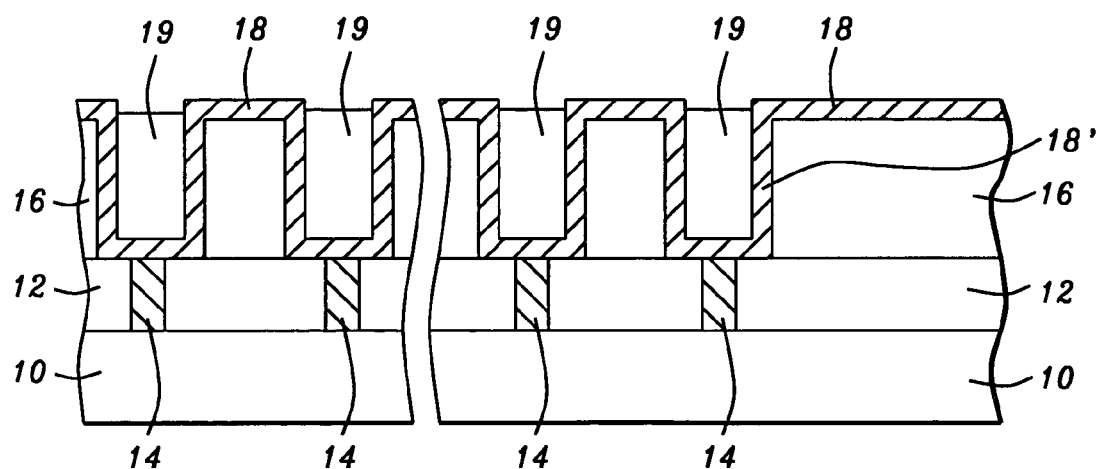

Referring to FIG. 6, in a second planarizing step, an etch-back is used to remove the remaining uniformly thick sacrificial layer 19 to expose the first conducting layer 18 on the top surface of the insulating layer 16, while leaving uniformly thick portions of the sacrificial layer 19 in the array of openings 4, which is not achieved in the prior art of FIG. 3. For example, when the sacrificial layer 19 is a polymer, such as photoresist, the etch-back can be carried out using a plasma etcher and an etchant gas such as $Cl_2$ and $BCl_3$. When layer 19 is a spin-on glass, the layer can be selectively etched back to the first conducting layer 18 using a plasma etcher and an etchant gas mixture such as $C_4F_8$ and $O_2$.

Figure 7:
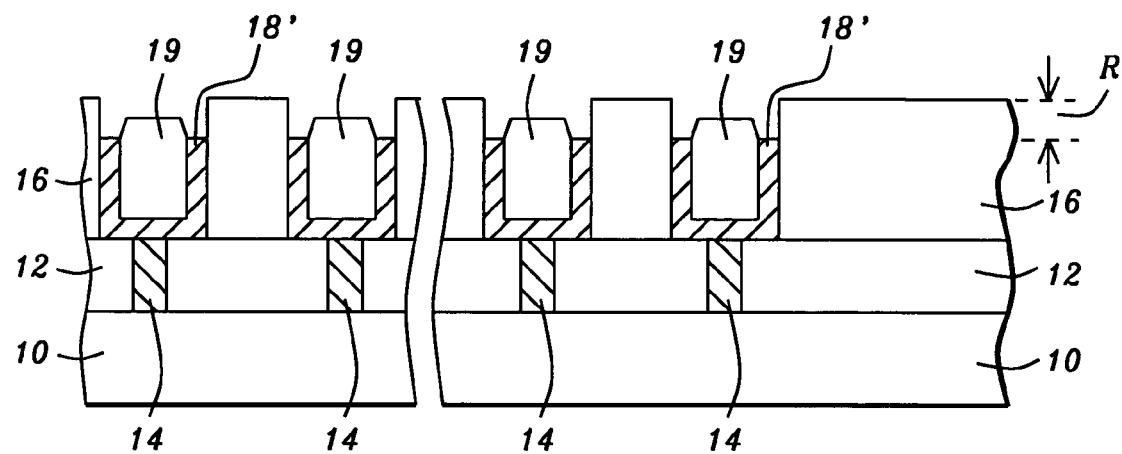

Referring to FIG. 7, the first conducting layer 18 is etched selectively to the surface of the insulating layer 16, and the first conducting layer 18 at the edge of the openings 4 is recessed to form the capacitor bottom electrodes 18'. Layer 18 is preferably etched using plasma etching and an etchant gas that is chlorine-based. The first conducting layer 18 is recessed to a depth R of between about 1000 to 2000 Angstroms below the top surface of the insulating layer 16. The recessing is required to prevent electrical shorts between the bottom electrode and the self-aligned top electrode. During etching to recess the first conducting layer 18, the sacrificial layer 19 protects the portions of the first conducting layer that form the bottom electrode 18' from erosion. The remaining sacrificial layer 19 in the openings 4 is removed. For example, when layer 19 is a polymer, the polymer can be selectively removed using plasma ashing in oxygen or ozone.

Figure 8:
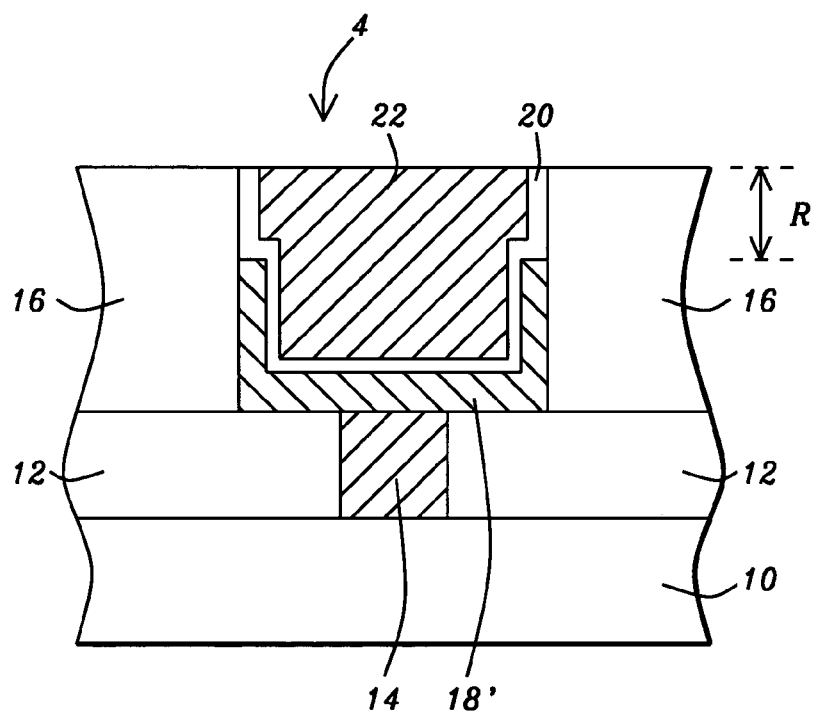

Referring to FIG. 8, after removing the sacrificial layer, the crown-shaped capacitors are completed by forming a relatively thin conformal capacitor dielectric film 20 over the bottom electrodes 18' in the openings 4, and forming capacitor top electrodes. The drawing in FIG. 8 shows an enlarged view of one capacitor of the array of capacitors to more clearly depict the structure. Layer 20 is a material having a high dielectric constant, such as aluminum oxide, hafnium oxide, tantalum pentoxide, BST, and the like. Layer 20 is formed, for example, by atomic-layer deposition or by chemical vapor deposition to a preferred thickness of between about 50 and 300 Angstroms. To complete the array of capacitors a second conducting layer 22 is deposited sufficiently thick to fill the openings 4, and more specifically to a thickness of between about 100 and 300 Angstroms. The second conducting layer 22 can be a doped polysilicon, but is preferably a metal or metal alloy having higher electrical conductivity (lower resistivity), such as titanium nitride, tantalum nitride, or tungsten nitride. The second conducting layer 22 and the capacitor dielectric film 20 are then planarized back to form capacitor top electrodes 22 self-aligned to the bottom electrodes 18' and coplanar with the top surface of the insulating layer 16. The planarization is carried out, for example, by chemical-mechanical polishing, or by plasma etch-back, or by a combination of these two process steps. As shown in FIG. 8, the recessing R of the bottom electrode 18' prevents electrical shorts to the top electrode 22 when the second conducting layer 22 is polished back or etched back to the insulating layer.

An important feature of this invention is that the two-step process used for planarizing the sacrificial layer 19 results in a more uniform value of R for the array of capacitors across the DRAM device and across the substrate.

Figure 9:
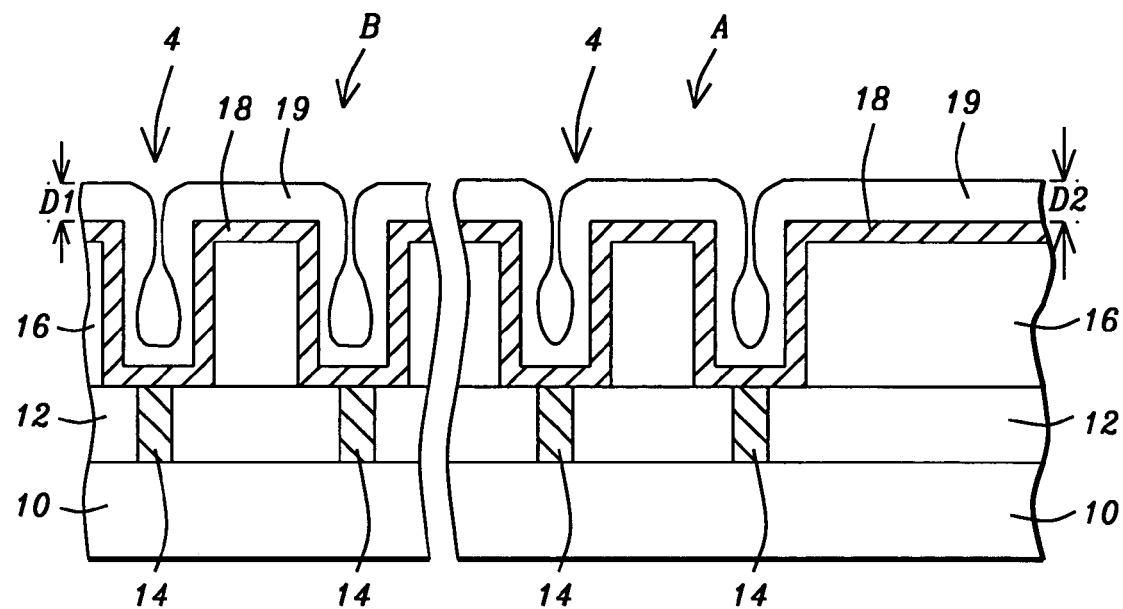
FIGS. 9–11 are schematic cross-sectional views showing a portion of a substrate depicting the sequence of process steps, by a second embodiment, using a CVD sacrificial layer and a single planarization process for making an array of crown-shaped capacitors having recessed bottom electrodes with uniform heights across each chip and across the substrate.
Figure 10:
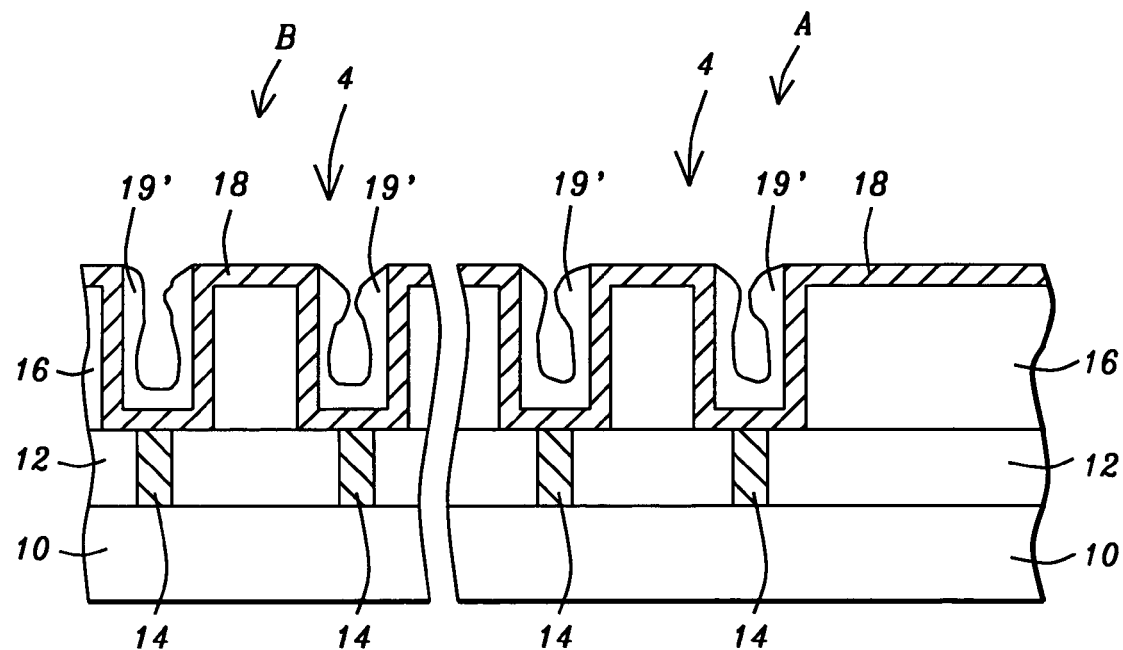
Figure 11:
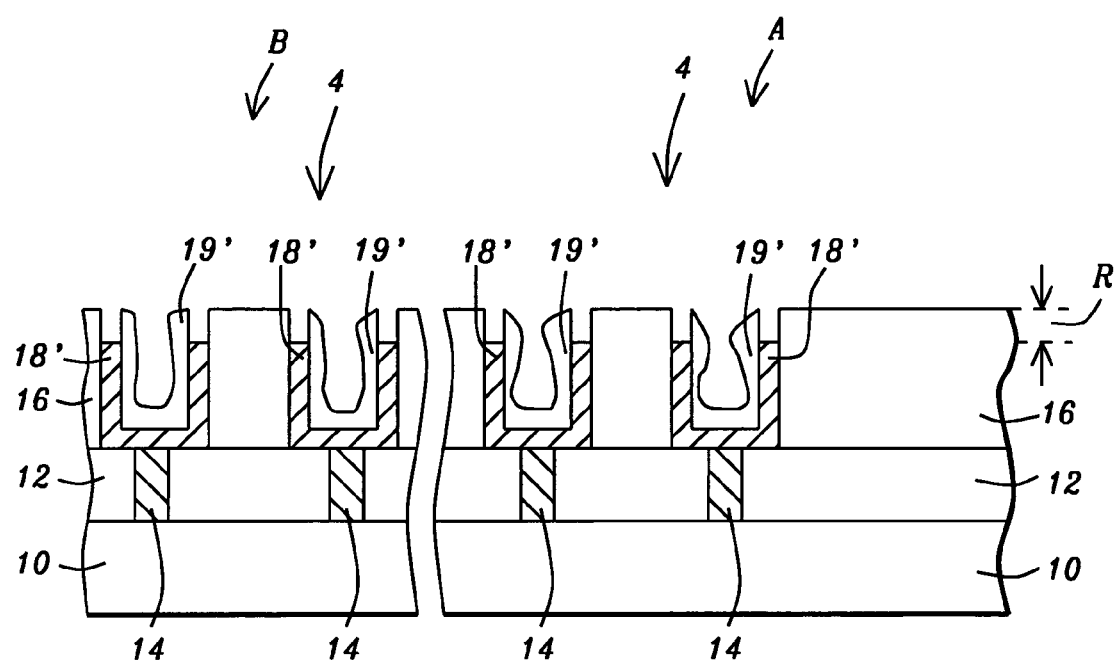

With reference to FIGS. 9 through 11, a method for making an array of crown-shaped capacitors with recessed bottom electrodes having improved uniformity across the DRAM device and across the substrate, by a second embodiment, is now described. The sequence of process steps is the same as in the first embodiment up to and including the deposition of the first conducting layer 18.

Referring to FIG. 9, after depositing the first conducting layer 18 and a key feature of the invention is to deposit a relatively thick sacrificial layer 19' by CVD to a thickness sufficient to protect the first conducting layer 18 in the array of openings 4 across the substrate. The sacrificial layer 19' is preferably a polymer, and is deposited, for example, using a reactant gas mixture such as $C_4F_8$ and CO. By appropriately selecting the ratio of $C_4F_8$ to CO and the processing parameters of the deposition system, a uniformly thick layer 19' can be achieved across the DRAM device and across the substrate. Since layer 19' is not spin-coated but is deposited by CVD, the uniformity in thickness is very good between the center D1 and edge D2 of the DRAM device (D1=D2). More specifically, layer 19' is deposited to a thickness of between about 4000 and 8000 Angstroms over the insulating layer 16.

Referring to FIG. 10, because of the uniform thickness of layer 19' a single planarization step is used to planarize layer 19' to the first conducting layer 18 on the insulating layer 16, while leaving portions of the sacrificial layer 19' to protect the first conducting layer 18 in the openings 4. More specifically, the sacrificial layer 19' can be planarized using a chemical-mechanical polish-back to the first conducting layer 18. Alternatively, polymer layer 19' can also be plasma etched back to the first conducting layer 18 using a reactant gas such as oxygen.

Referring to FIG. 11, the process is similar to the first embodiment. The first conducting layer 18 is etched to the top surface of the insulating layer 16, and the first conducting layer 18 is exposed at the edges of the openings 4. The first conducting layer 18 is recessed to a depth R below the top surface of the insulating layer 16 to form capacitor bottom electrodes 18'. The remaining sacrificial layer 19' in the openings 4 is then removed, for example, by plasma ashing in oxygen or ozone.

The array of capacitors are then completed by the method described in the first embodiment, as depicted in FIG. 8. A relatively thin conformal capacitor dielectric film 20 is formed on the substrate and over the bottom electrodes 18'. A second conducting layer 22 is deposited. Layers 22 and 20 are polished back to the surface of the insulating layer 16 to form self-aligned top electrodes 22 in the openings 4.

An important feature of the second embodiment is that the CVD polymer layer 19' is formed to a uniform thickness and can be planarized using a single planarization step. The second embodiment also leads to a more uniform value of R for the array of capacitors across the DRAM device and across the substrate. Since the bottom electrodes are more uniform in height across the DRAM device and across the substrate, the capacitance of the array can be maintained within the electrical design specification for the product.

While the invention has been particularly shown and described with reference to the preferred embodiments thereof, it will be understood by those skilled in the art that various changes in form and details may be made without departing from the spirit and scope of the invention.

What is claimed is:

1. A method for making improved bottom electrodes for crown-shaped capacitors on a substrate comprising the steps of:

providing said substrate having device areas;

providing an insulating layer with openings formed therein, wherein the openings are formed in a central region and a edge region of the device areas;

depositing a conformal first conducting layer on said insulating layer and in said openings;

forming a blanket sacrificial layer sufficiently thick to fill said openings;

partially removing said sacrificial layer to form a planar surface across said substrate and to expose said first conducting layer on top surface of said insulating layer while leaving portions of said sacrificial layer in said openings, wherein the sacrificial layer left in said openings at the central region and the edge region of the device areas have a substantially same height;

recessing said first conducting layer in said openings to form said bottom electrodes;

removing said sacrificial layer in said openings;

forming a conformal capacitor dielectric film over said bottom electrodes and on said substrate; and forming a second conducting layer in said openings to form self-aligned top electrodes.

2. The method of claim 1, wherein prior to depositing said insulating layer a node insulating layer is deposited on said substrate, node openings are formed in said node insulating layer to said device areas, and conducting plug contacts are formed in said node openings to said device areas.

3. The method of claim 2, wherein said node insulating layer is a chemical-vapor-deposited silicon oxide and is deposited to a thickness of between about 5000 and 10000 Angstroms.

4. The method of claim 2, wherein said conducting plug contacts in said node openings to said device areas are doped polysilicon, tungsten, metal silicides, or metals.

5. The method of claim 1, wherein said insulating layer is a chemical-vapor-deposited silicon oxide and is deposited to a thickness of between about 5000 and 15000 Angstroms.

6. The method of claim 1, wherein said first conducting layer is selected from the group that includes titanium nitride, tantalum nitride, and tungsten nitride, and is deposited to a thickness of between about 100 and 300 Angstroms.

7. The method of claim 1, wherein said blanket sacrificial layer is a polymer and is spin coated to a thickness of between about 4000 and 10000 Angstroms over top surface of said insulating layer.

8. The method of claim 1, wherein said blanket sacrificial layer is partially removed to have a thickness of about 0 to 2000 Angstroms over said insulating layer.

9. The method of claim 1, wherein said blanket sacrificial layer is partially removed by chemical-mechanical polishing and by plasma etching using an etchant gas mixture of $Cl_2$ and $BCl_3$.

10. The method of claim 1, wherein said recessing said first conducting layer is carried out in a plasma etcher using a chlorine-based gas.

11. The method of claim 1, wherein said first conducting layer is recessed to a depth of between about 1000 and 2000 Angstroms below top surface of said insulating layer.

12. The method of claim 1, wherein said capacitor dielectric film is a high-dielectric-constant material and is deposited to a thickness of between about 50 and 300 Angstroms.

13. The method of claim 12, wherein said high-dielectric-constant material is selected from the group that includes tantalum pentoxide, BST, $Al_2O_3$, and $HfO_2$.

14. The method of claim 1, wherein said self-aligned top electrodes are formed by depositing said second conducting layer sufficiently thick to fill said openings and polishing back to said insulating layer.

15. The method of claim 1, wherein said second conducting layer is a material selected from the group that includes titanium nitride, tantalum nitride, and tungsten nitride.

16. The method of claim 1, wherein the sacrificial layer left in said openings at the central region and the edge region of the device areas is substantially coplanar with the first conducting layer on the insulating layer.

* * * * *